US006819396B1

(12) United States Patent
Tanabe et al.

(10) Patent No.: US 6,819,396 B1
(45) Date of Patent: Nov. 16, 2004

(54) EXPOSURE APPARATUS, AND DEVICE MANUFACTURING METHOD

(75) Inventors: Masayuki Tanabe, Utsunomiya (JP); Yasuaki Fukuda, Utsunomiya (JP); Masami Tsukamoto, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 118 days.

(21) Appl. No.: 09/712,979

(22) Filed: Nov. 16, 2000

(30) Foreign Application Priority Data

Nov. 16, 1999 (JP) .......................................... 11-325785

(51) Int. Cl.⁷ .......................... G03B 27/52; G03B 27/42
(52) U.S. Cl. ........................................ 355/30; 355/53
(58) Field of Search ............................ 355/30, 53, 67, 355/68–71; 359/350; 96/58, 69; 250/559.4, 222.2

(56) References Cited

U.S. PATENT DOCUMENTS

| | | | |
|---|---|---|---|
| 5,024,968 A | 6/1991 | Engelsberg | 437/173 |
| 5,099,557 A | 3/1992 | Engelsberg | 29/25.01 |
| 5,221,520 A * | 6/1993 | Cornwell | 422/122 |
| 5,430,303 A * | 7/1995 | Matsumoto | 250/492.2 |
| 5,508,528 A | 4/1996 | Mulkens et al. | 250/492.1 |
| 5,531,857 A | 7/1996 | Engelsberg et al. | 156/345 |
| 5,602,683 A | 2/1997 | Straaijer et al. | 359/811 |
| 5,643,472 A | 7/1997 | Engelsberg et al. | 216/65 |
| 5,667,564 A | 9/1997 | Weinberg | 96/58 |
| 5,685,895 A | 11/1997 | Hagiwara et al. | 96/117 |
| 5,814,135 A | 9/1998 | Weinberg | 96/58 |
| 5,821,175 A | 10/1998 | Engelsberg | 438/795 |
| 5,906,429 A | 5/1999 | Mori et al. | 362/293 |
| 5,958,268 A | 9/1999 | Engelsberg et al. | 219/121.84 |
| 6,036,738 A * | 3/2000 | Sanbrom | 55/524 |
| 6,042,637 A | 3/2000 | Weinberg | 96/58 |
| 6,048,588 A | 4/2000 | Engelsberg | 427/554 |
| 6,193,788 B1 * | 2/2001 | Nojima | 96/97 |
| 6,194,821 B1 * | 2/2001 | Nakamura | 313/238 |
| 6,222,610 B1 * | 4/2001 | Hagiwara et al. | 355/30 |
| 6,288,769 B1 * | 9/2001 | Akagawa et al. | 355/30 |

FOREIGN PATENT DOCUMENTS

| | | | |
|---|---|---|---|
| EP | 0 879 997 | | 11/1998 |
| EP | 0 957 402 | | 11/1999 |
| JP | 357122924 A | * | 7/1982 |
| JP | 01265513 | | 10/1989 |
| JP | 2-86128 | | 3/1990 |
| JP | 406323571 A | * | 1/1994 |
| JP | 6-45229 | | 2/1994 |
| JP | 6-77114 | | 3/1994 |
| JP | 7-74077 | | 3/1995 |
| JP | 7-201728 | | 8/1995 |
| JP | 7-209569 | | 8/1995 |
| JP | 8-55774 | | 2/1996 |
| JP | 8-306599 | | 11/1996 |
| JP | 2670020 | | 7/1997 |
| JP | 10-112429 | | 4/1998 |
| JP | 10-180139 | | 7/1998 |
| JP | 10242029 | | 9/1998 |
| JP | 10-289854 | | 10/1998 |
| JP | 10-314575 | | 12/1998 |
| JP | 11-67618 | | 3/1999 |
| JP | 11067618 | * | 3/1999 |
| JP | 11-111593 | | 4/1999 |
| JP | 11-111606 | | 4/1999 |
| WO | WO 99/36950 | | 7/1999 |

OTHER PUBLICATIONS

"Scanning Excimer Ablation Tool," *IBM Technical Disclosure Bulletin*, vol. 34, No. 7A, Dec. 1991, pp. 232–233.

European Search Report dated Feb. 25, 2002 for European Application No. 00 31 0139.

* cited by examiner

*Primary Examiner*—Henry Hung Nguyen
(74) *Attorney, Agent, or Firm*—Fitzpatrick, Cella, Harper & Scinto

(57) ABSTRACT

Disclosed is an exposure apparatus which includes an optical element, a gas supplying unit for supplying a predetermined gas around the optical element, and an organic compound decomposition mechanism for decomposing an organic compound in the gas. This structure prevents adhesion of organic compounds to the optical element without a necessity of using many filters in combination.

36 Claims, 4 Drawing Sheets

EXPOSURE APPARATUS, AND DEVICE MANUFACTURING METHOD

FIELD OF THE INVENTION AND RELATED ART

This invention relates to an exposure apparatus having a light source of a short wavelength such as ultraviolet region and being arranged so that a gas flows around an optical element. Also, it relates to a device manufacturing method using such an exposure apparatus.

As regards light sources of exposure apparatuses, shortening the wavelength of light has been required. Currently, light of a standard ultraviolet region or light of a vacuum ultraviolet region is used. Generally, as the wavelength of light becomes shorter, the optical energy thereof becomes gradually larger. For example, as regards the photon energy of excimer lasers, it is 477.6 kJ/mol for a KrF laser (248 nm), 616.2 kJ/mol for an ArF laser (193 nm) and 753.9 kJ/mol for an $F_2$ laser (157 nm). In these wavelength regions, there occurs light absorption in various matters. Further, there may occur decomposition or composition of substances due to a photochemical reaction. Thus, substances being present inside the apparatus may be deposited on an optical element to cause light absorption, or matters produced by a photochemical reaction may be deposited on an optical element to deteriorate the optical characteristic thereof. Further, any impurities mixed in a gas along an optical path may function to deteriorate the optical characteristic.

As regards problems which are attributable to those substances contained in an environment of optical elements, conventionally, a filter is used to improve the purity of a gas to be introduced or, alternatively, a gas of a higher purity is supplied, to thereby prevent deposition or to avoid absorption of light by impurities.

The contamination of the surface of an optical element in an exposure apparatus causes degradation of the optical characteristic thereof. The deterioration of the optical characteristic due to such surface deposition of the optical element becomes serious as the wavelength of the light source becomes short. This is for the following reasons. First, even if matter which is deposited on an optical element is not influential to the optical characteristic thereof in a range from the visible region to the standard ultraviolet region, it may function to absorb light of a shorter wavelength and may become adversely influential to the optical characteristic. Second, due to an increased photon energy of the light source, a photochemical reaction in which matter present along the optical path is involved is activated such that a reaction product is adhered to and deposited on the optical element to cause contamination of the same. Further, as regards matter mixed in a gas along the optical path, the matter may function as an impurity to cause degradation of the optical characteristic, or a photochemical reaction may produce impurities causing degradation of the optical characteristic. Thus, when the wavelength of a light source is shortened, many organic compounds which have not raised problems become impurities that cause deterioration of the optical characteristic.

Conventional filters for removing impurities function to attract impurities at a gas inlet of the apparatus to thereby remove them. As regards such filters, a filter which uses an ion exchange resin, activated charcoal or zeolite may be used. Alternatively, a chemical filter having acid matter or alkaline matter attached may be used. These filters have known properties, and a single filter does not attract and remove all the impurities. Thus, an optimum filter may be selected and used in accordance with a substance to be removed. If, therefore, there are different substances to be removed, optimum filters corresponding to these substances should be used in combination. This means that, if there are many varieties of impurities to be removed and they have different properties, a lot of optimum filters corresponding to these properties should be used. Thus, it is necessary to use many filters in combination.

In order to meet the problem of impurities described above, it is necessary to take measures not only for impurities contained in a gas from a supply source and for impurities resulting from a degassed component produced from a member during passage through a gas supply unit, but also for impurities resulting from a degassed component produced from a member inside and an optical unit or the like. As regards phthalic acid esters such as dibutyl phthalate (D.B.P.) or dioctyl pbthalate (D.O.P.), for example, if they are present in an ambience of an apparatus as being degassed from a member used, they are adhered to and deposited on an optical element because of their strong absorptivity with respect to light of a short wavelength. Although these substances are organic compounds having a relatively small volatility, since they are used widely as a plasticizer, they will easily become impurities in the atmosphere.

As regards matters deposited on an optical element, a photo-washing process for removing matters deposited on an optical element by an optical decomposition reaction based on light irradiation may be done. It has an additional effect of elimination by heating, or an effect of acceleration of a decomposition reaction as oxygen is changed to ozone or active oxygen. However, all the substances upon the optical element are not removed. There may be substances remaining on the optical element Also, to the contrary, matter mixed in an ambient gas may react by the irradiation with light, and reaction products may be deposited. As a matter of course, it is very difficult to remove contamination substances which have formed a mechanical connection with the surface of an optical element, and also it is a problem to remove substances adhered to or deposited on the optical element.

SUMMARY OF THE INVENTION

It is an object of the present invention to provide an exposure apparatus and/or a device manufacturing method using the same, by which adhesion of organic compounds to an optical element is prevented without a necessity of using many filters in combination.

It is another object of the present invention to provide a process or an arrangement effective to assure that no organic compound is present in a gas which flows along the surface of an optical element.

In accordance with an aspect of the present invention, there is provided an exposure apparatus, comprising: an optical element; a gas supplying unit for supplying a predetermined gas around said optical element; and an organic compound decomposition mechanism for decomposing and removing an organic compound in the gas.

Preferably, the apparatus may further comprise a filter for removing a substance produced by the decomposition of the organic compound.

The apparatus may further comprise a chamber for accommodating therein a structure to allow the flow of the gas, wherein said organic compound decomposition mechanism may be disposed at at least one of an inlet port of the gas from said gas supplying unit to said chamber and a vicinity of said optical element.

The organic compound decomposition mechanism may decompose an organic compound by an electric discharging process.

The organic compound decomposition mechanism may decompose an organic compound on the basis of ionized atoms produced by electric discharging such as plasma discharging and corona discharging.

The apparatus may further comprise a filter for removing a substance produced by the decomposition of the organic compound based on the discharging process.

The apparatus may further comprise a filter for removing $H_2O$ produced by the discharging process.

The organic compound decomposition mechanism may include a fan for introducing the gas and a flow gauge for monitoring a flow rate of the gas.

The organic compound decomposition mechanism may adjust said fan on the basis of an output of said flow gauge.

The organic compound decomposition mechanism may include a catalyst for decomposing ozone.

The gas may be circulated through said organic compound decomposition mechanism.

In accordance with another aspect of the present invention, there is provided a device manufacturing method, comprising the steps of: preparing an exposure apparatus as recited above; and performing an exposure process by use of the exposure apparatus while decomposing an organic compound by use of an organic compound decomposition mechanism of the exposure apparatus.

The method may further comprise removing a substance produced by the decomposition of the organic compound, by use of a filter.

In the present invention, an organic compound decomposition mechanism may be provided to decompose and remove an organic compound in a gas on the basis of an electric discharging process. This eliminates the necessity of using many filters in combination. Only a few filters for removing substances produced by the decomposition may be necessary. If the substances produced by the decomposition can be disregarded, these filters may be omitted.

The organic compound decomposition mechanism may be provided in the vicinity of an optical element. With this structure, a degassed component from a member inside the apparatus can be removed, and it can be assured that no organic compound is present in a gas flowing along the surface of the optical element. As a result of it, degradation of the optical performance of the optical element can be prevented effectively.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Preferred embodiments of the present invention will now be described with reference to the accompanying drawings.

A first embodiment of the present invention will now be described. In an exposure apparatus according to this embodiment, there are organic compound decomposition mechanisms which are disposed inside the exposure apparatus and also at a gas inlet port for introducing a gas from a gas supplying unit into the exposure apparatus. Each organic compound decomposition mechanism has an electrode for electric discharging. Through the electric discharging by the electrode, organic compounds can be decomposed, such that organic compounds contained in the gas flowing to the optical element can be removed.

Figure 1:
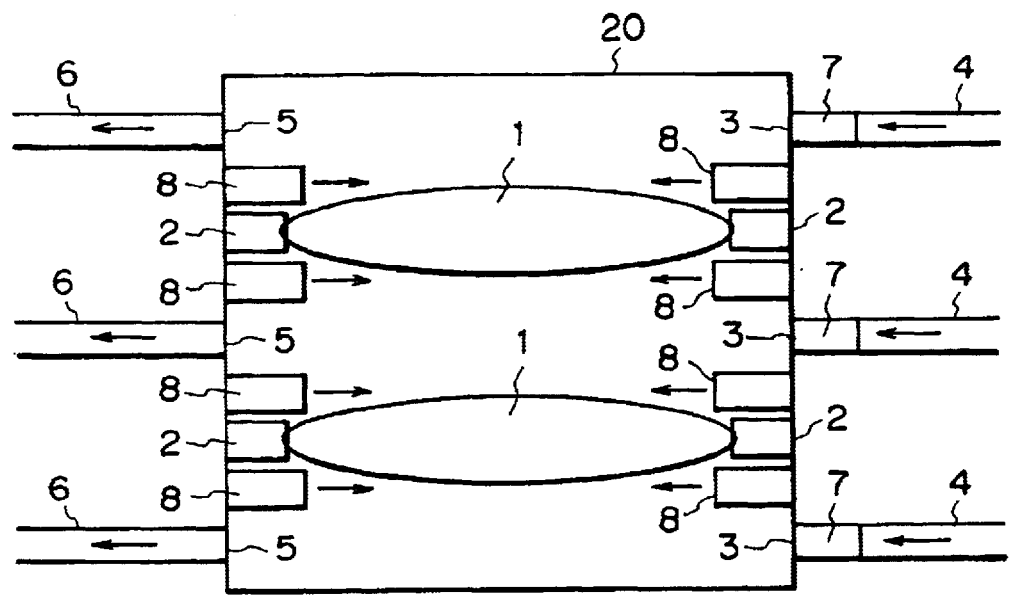
FIG. 1 is a schematic view of a main portion of an exposure apparatus with optical elements, according to an embodiment of the present invention.

FIG. 1 is a schematic view of the exposure apparatus of this embodiment, and it shows an optical system in a space in which optical elements are gas-purged.

Denoted in FIG. 1 at 1 are optical elements (lenses), and denoted at 2 are lens supports for supporting the optical elements (lenses). Denoted at 20 is a chamber for accommodating the structure therein while allowing the flow of a gas, and denoted at 3 are gas inlet ports for introducing gases into the chamber. Denoted at 4 are gas supplying units for supplying gases through the inlet ports 3, and denoted at 5 are gas outlet ports for discharging gases from the chamber. Denoted at 5 are exhaust units for discharging gases through the outlet ports 5. Denoted at 7 are organic compound decomposition mechanisms which are provided just before the gas inlet ports 3, respectively. Denoted at 8 are organic compound decomposition mechanisms which are disposed adjacent to the optical elements 1.

As shown in FIG. 1, each organic compound decomposition mechanism 7 is provided just before the gas inlet port 3. With this structure, organic compounds which may contain degassed components from the members of the gas supplying unit 4 can be decomposed and removed. Further, the organic compound decomposition mechanisms 8 are provided in the vicinity of the optical elements 1. With this structure, organic compounds produced from inside members of the apparatus as degassed components can be removed. Each organic compound decomposition mechanism 8 includes a gas introducing port at the lens support 9 or at an inside wall of the structure, from which a gas which contains organic compounds as degassed components from the members is introduced, and the organic compound decomposition process is performed. Each organic compound decomposition mechanism 8 has a gas discharging port, facing to the optical element (lens). From these gas discharging ports, gases with organic compounds removed are discharged toward the lenses, such that clean gases are supplied to the lens surfaces.

Figure 2:
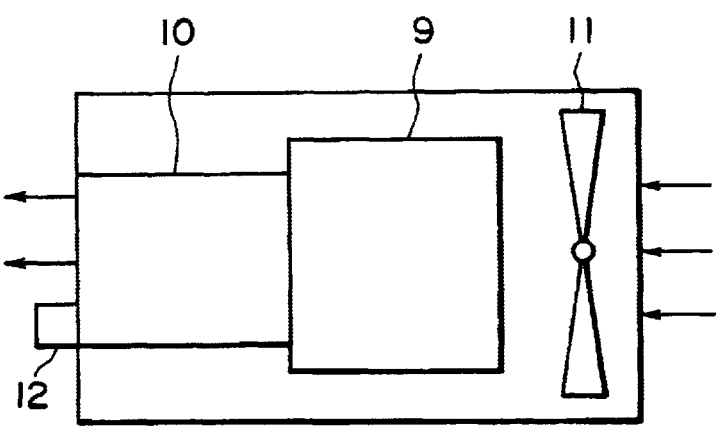
FIG. 2 is a schematic view of an organic compound and impurity removing mechanism in the apparatus of FIG. 1.

FIG. 2 is a schematic view of one organic compound decomposition mechanism. It includes an electric discharging unit 9 which comprises a pair or more of a discharging electrode and an opposed electrode, necessary for corona discharge or plasma discharge for decomposition of organic compounds. Through the electric discharge such as corona discharge or plasma discharge in the discharging unit 9, ionized atoms are produced. At a portion downstream of the discharging unit 9, there is a filter unit 10 which is provided, as desired, to remove substances to be produced as a result of the decomposition of organic compounds. Due to the decomposition by electric discharge, an organic compound is changed to have a similar structure. Also, the kinds of organic compounds are reduced Therefore, the filter unit 10 needs only a few filters to be use. If the organic compounds are completely decomposed into $CO_2$ and $H_2O$ by the electric discharging, only filters for removing $CO_2$ and $H_2O$ are necessary. If $CO_2$ and $H_2O$ are at low levels so that the optical performance is not degraded thereby, the filter unit 10 may be omitted.

However, not only is $H_2O$ itself a matter that may cause deterioration of the optical performance but also there is a possibility that it reacts with a degassed component from a resist, for example, to produce ammonia or an ammonium ion. These substances may be adhered to and deposited on an optical element to cause deterioration of the optical characteristic thereof. Therefore, it is necessary to move $H_2O$ sufficiently. In this respect, use of a filter for removing $H_2O$ is particularly preferable.

If a purge gas contains oxygen, there is a possibility that the electric discharging causes production of ozone. Since ozone has a strong reactivity, it can accelerate decomposition of organic compounds. However, if there is ozone inside the exposure apparatus, a decomposition reaction may occur also at surfaces of inside component members of the apparatus, resulting in an increase of impurities inside the exposure apparatus. In consideration of this, the filter unit 10 may be provided with an ozone decomposing catalyst for decomposing ozone. As regards such an ozone decomposing catalyst, a catalyst containing manganese dioxide is widely known. Also, ozone can be reduced to oxygen by use of activated charcoal. Further, it is known that, generally, if the electric discharging is done with a voltage not larger than 10 kV, the amount of ozone production is much reduced. In consideration of the above, an ozone concentration gauge may be provided so that the discharging voltage may be adjusted while monitoring the ozone concentration. With this arrangement, adverse influence of ozone to surfaces of components of the exposure apparatus can be prevented. Since no discharge occurs with a too low voltage, in the presence of oxygen, the discharging voltage may preferably be set in a range of 5–10 kV.

The electrode of the discharging unit 9 may have a honeycomb structure by which the contact area with the gas as well as the electric discharging efficiency can be increased. Further, the space to be occupied can be made smaller. Similar advantageous results are attainable when a spiral structure or a layered (laminated) structure is used. As regards an opposed electrode to such a discharging electrode, it should have an electric conductivity to assure the discharging. When a material having a catalyst function such as platinum or palladium, for example, is used, the effect thereof can be improved.

If the velocity of the gas flowing through the discharging unit 9 is too large, organic compounds contained in the gas cannot be decomposed sufficiently. It is, therefore, necessary to control the gas flow. In consideration of this, as shown in FIG. 2, there are a fan 11 and a flow rate gauge 12 such that the decomposition of organic compounds is performed while monitoring the gas flow rate. Further, organic compounds can be decomposed sufficiently when the gas is circulated and caused to flow repeatedly through the discharging unit 9. Any non-reacted matter not decomposed by the electric discharging may be attracted by using an attraction filter, and may be decomposed by repeating the electric discharging.

As long as the removal of impurities is made sufficiently, the gas may be circulated inside the exposure apparatus or the gas discharged outwardly through the outlet port of the exposure apparatus may be introduced into an inlet port of the apparatus for the circulation, by which the apparatus can be operated stably without a large consumption of gases.

Circulating a purge gas is very effective with respect to the cost, particularly, when helium gas, which is expensive as compared with clean dry air or nitrogen gas used as the purge gas.

Figure 3:
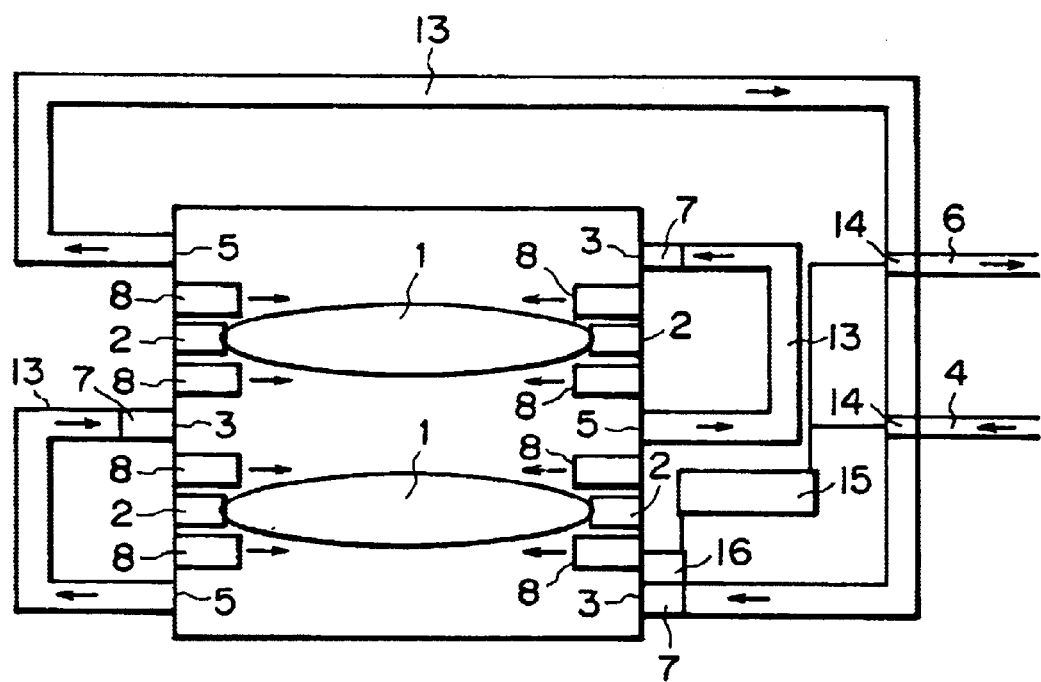
FIG. 3 is a schematic view of a main portion of an exposure apparatus, with a purged gas circulation mechanism, according to another embodiment of the present invention.

FIG. 3 is a schematic view of an optical system in a space in which optical elements of an exposure apparatus are purged with a gas which is circulated in the structure. Gases which are discharged through gas discharging ports 5 flow through a gas circulation unit 13 and are introduced into the structure from gas inlet ports 3. Organic compound decomposition mechanisms 7 disposed just before the gas inlet ports 3 decompose and remove organic compounds. There is an electromagnetic valve 14 which functions to discharge the circulated gas outwardly through a discharging unit 6 and also to supply a fresh gas from a gas supplying unit 4. The circulation gas exchange is made in this manner. Such circulation gas exchange may be done at regular periods in which the removal of impurities is made sufficiently. Preferably, however, a sensor 16 may be provided to monitor the concentration of organic compounds such that, when the concentration becomes higher than a predetermined level, the electromagnetic valve 14 may be actuated through a controller 15 to execute the gas exchange. Here, it is to be noted that this embodiment is not limited to the use of an electromagnetic valve. A variable valve by which the flow rate can be adjusted may be used. In such a case, the adjustment of the flow rate of the variable valve may be controlled in accordance with a signal from the sensor 16, concerning the concentration of organic compounds.

When the gas is circulated such as shown in FIG. 3, the placement of the organic compound decomposition mechanism is not limited to a position at the inlet port 3 of the chamber or in the vicinity of the optical element 1, as illustrated. The mechanism may be provided in a portion of the path of the gas circulation unit 13.

Specific examples wherein organic compounds were decomposed and removed by use of an organic compound decomposition mechanism provided in an exposure apparatus, will now be described.

EXAMPLE 1

Organic compound decomposition mechanisms having discharging electrodes were mounted adjacent to each optical element such as lenses and mirrors of a KrF exposure apparatus, using clean dry air as a purge gas. Each organic compound decomposition mechanism was provided with an ozone decomposition catalyst, mainly containing manganese dioxide, disposed after the discharging unit 9. By using the organic compound decomposition mechanisms, with a maximum discharging voltage of 10 kV to suppress ozone production, decomposition and removal of organic compounds were carried out. While oxygen was partly reduced to ozone as a result of it, the ozone was processed inside the organic compound decomposition mechanism, by means of the ozone decomposition catalyst after the discharging unit 9. With the provision of the organic compound decomposition mechanism such as described above, production of substances which may cause absorption of light upon the optical element in response to projection of KrF laser light, was prevented. As a result of it, deterioration of the optical element was avoided.

In this example, every optical element is equipped with an organic compound decomposition mechanism disposed adjacent to it. However, such mechanisms may be provided only in portions where the influence of degradation of the optical performance is large. Further, although the ozone decomposition catalyst used one having manganese dioxide as a major component, a catalyst without manganese dioxide may be used as long as it has a function of ozone decomposition.

EXAMPLE 2

For an exposure apparatus in which optical elements were fixed on a fixing frame by an adhesive agent, removal of organic compounds was carried out in a similar manner as in Example 1 above. As a result, eliminated gases from the adhesive agent were attracted and removed by organic compound decomposition mechanisms, so that they did not flow along the surfaces of the optical elements. As a result of it, the optical performance or adhesion strength of the optical elements was not degraded, and only depositions were removed.

EXAMPLE 3

The decomposition and removal of organic compounds were carried out in a similar manner as in Example 1 above, except that organic compound decomposition mechanisms were mounted adjacent to optical elements such as lenses and mirrors of an ArF exposure apparatus. Since, in an ArF laser, the absorption of oxygen is large, nitrogen gas was used as a purge gas. As a result, although there was no effect of accelerating a decomposition reaction of organic compounds by ozone produced by catalyst discharge, no substance was produced on the optical elements also in the case of an ArF exposure apparatus to cause absorption. The optical performance was maintained.

EXAMPLE 4

In this example, the removal of organic compounds was carried out in a similar manner as Example 3 above, except that a helium gas was used as a purge gas in an ArF exposure apparatus. Also, in this example, production of substances upon optical elements, causing absorption, was prevented, and deterioration of the optical characteristic was avoided.

EXAMPLE 5

In an $F_2$ exposure apparatus, organic compound decomposition mechanisms having discharging electrodes were mounted adjacent to optical elements such as lenses and mirrors. The decomposition and removal of organic compounds were carried out in a similar manner as Example 3 above, by use of a nitrogen gas or a helium gas as a purge gas. Also, in this example, production of substances upon optical elements, causing absorption, was prevented, and deterioration of the optical characteristic was avoided.

EXAMPLE 6

In relation to exposure apparatuses in which a purge gas was circulated through a space where optical elements were accommodated, the removal of organic compounds was carried out in a similar manner as in Examples 1–5 above. With respect to any one of a KrF exposure apparatus, an ArF exposure apparatus and an $F_2$ exposure apparatus, the optical characteristic was held and the apparatus could be operated stably without a large consumption of gases.

Next, an embodiment of a semiconductor device manufacturing method which uses an exposure apparatus such as described above, will be explained.

Figure 4:
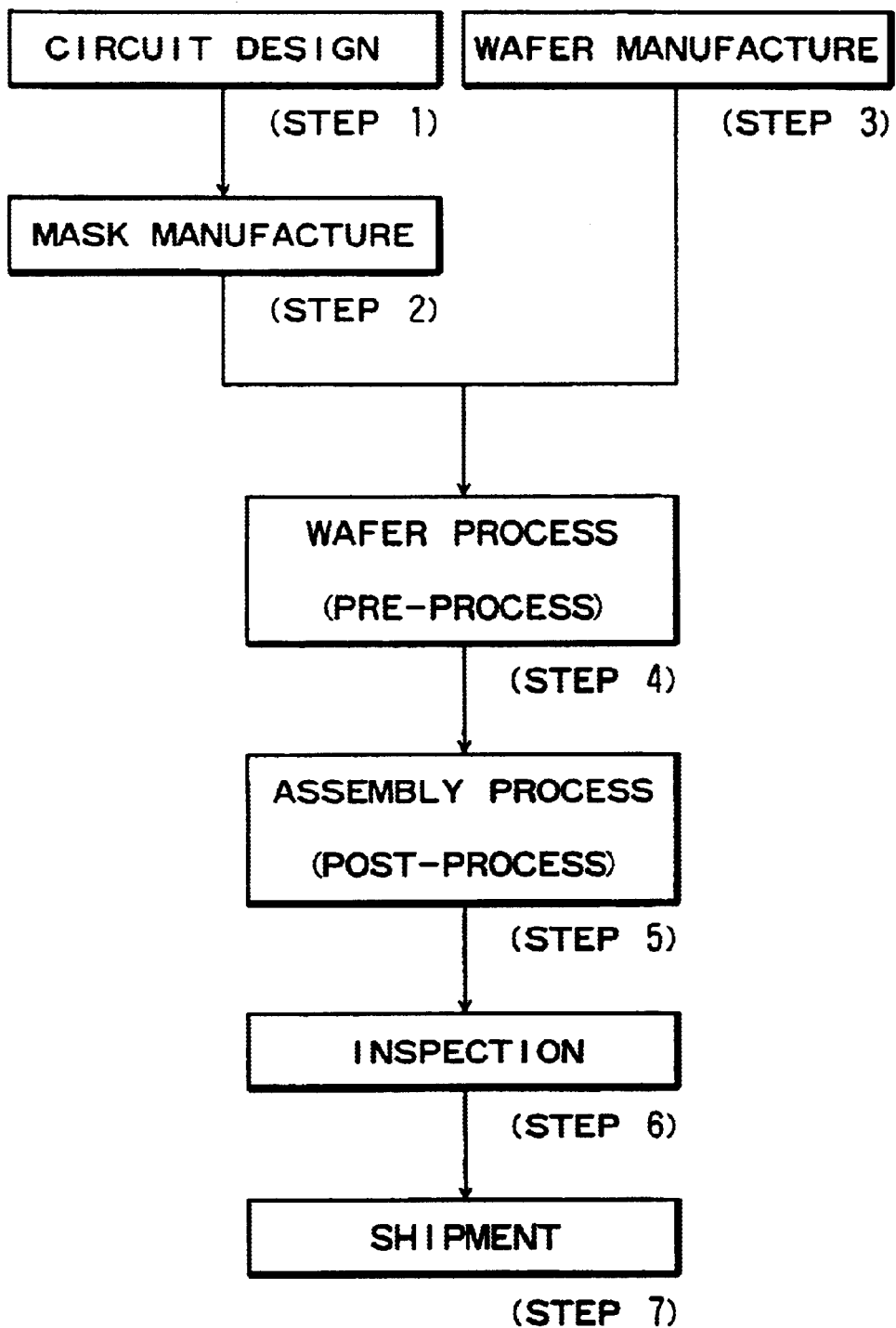
FIG. 4 is a flow chart of device manufacturing processes in which an exposure apparatus according to the present invention can be used.

FIG. 4 is a flow chart of a procedure for the manufacture of microdevices such as semiconductor chips (e.g., ICs or LSIs), liquid crystal panels, CCDs, thin film magnetic heads or micro-machines, for example.

Step 1 is a design process for designing a circuit of a semiconductor device. Step 2 is a process for making a mask on the basis of the circuit pattern design. Step 3 is a process for preparing a wafer by using a material such as silicon. Step 4 is a wafer process (called a pre-process) wherein, by using the so prepared mask and wafer, circuits are practically formed on the wafer through lithography. Step 5 subsequent to this is an assembling step (called a post-process) wherein the wafer having been processed by step 4 is formed into semiconductor chips. This step includes an assembling (dicing and bonding) process and a packaging (chip sealing) process. Step 6 is an inspection step wherein an operation check, a durability check and so on for the semiconductor devices provided by step 5, are carried out. With these processes, semiconductor devices are completed and they are shipped (step 7).

Figure 5:
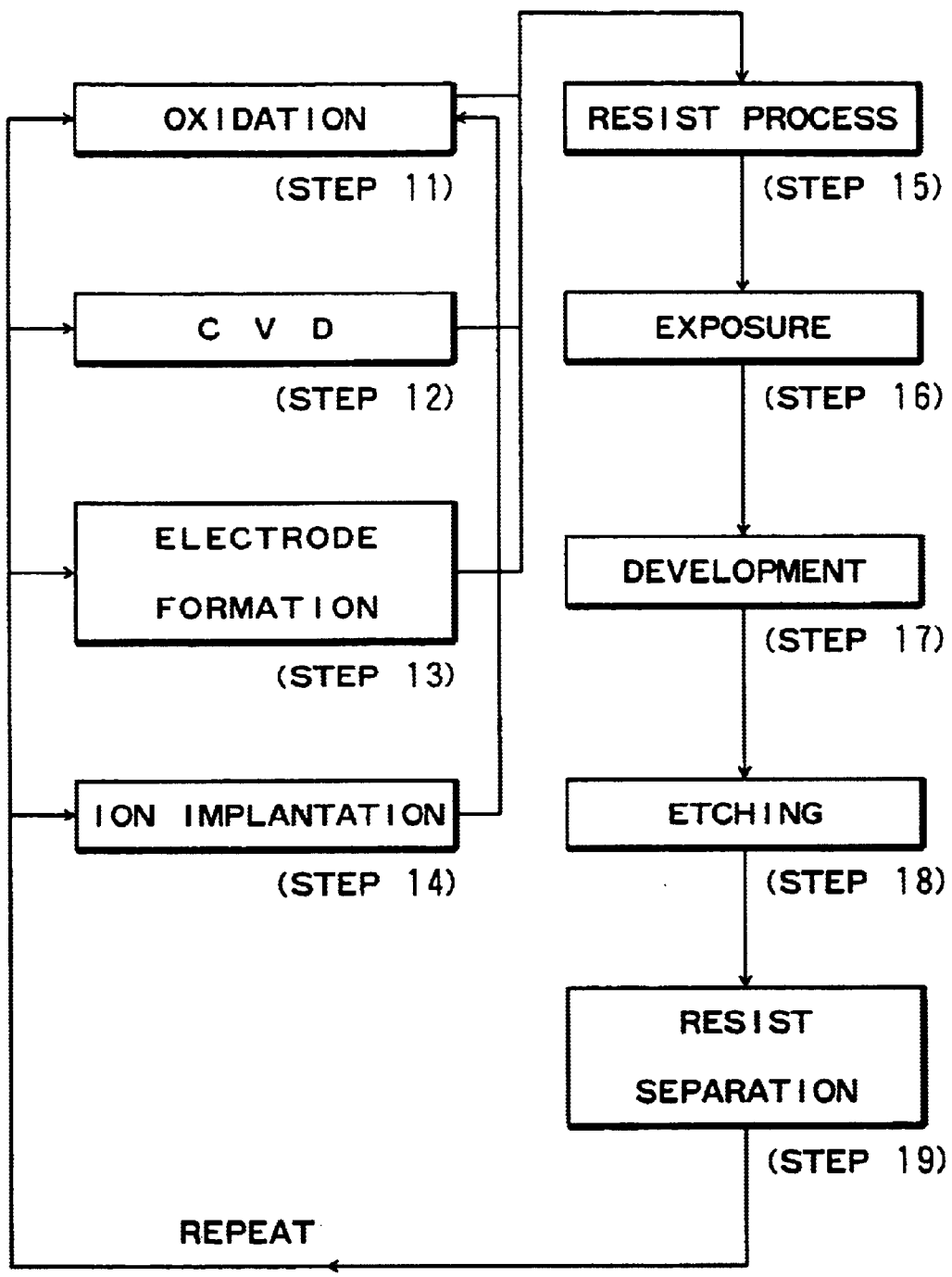
FIG. 5 is a flow chart for explaining details of a wafer process in the procedure shown in FIG. 4.

FIG. 5 is a flow chart showing details of the wafer process.

Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured.

In accordance with the present invention as described hereinbefore, use of organic compound removing means for removing organic compounds in a gas on the basis of electric discharge effectively avoids the necessity of using many filters in combination, and it prevents adhesion of organic compounds on an optical element. The organic substance decomposition means may be provided adjacent to an optical element, by which a degassed component from an inside member can also be removed. This effectively assures that no organic compound is present in a gas flowing along the surface of the optical element. As a result of it, deterioration of the optical performance of the optical element can be prevented effectively. Further, a supplied gas may be circulated and purified through organic compound decomposition means. This provides an exposure apparatus which does not consume a large quantity of gas and thus which is very effective with respect to the cost. Further, in accordance with a device manufacturing method using such an exposure apparatus, a high precision exposure process can be performed without degradation, and very precise devices can be produced thereby.

While the invention has been described with reference to the structures disclosed herein, it is not confined to the details set forth and this application is intended to cover such modifications or changes as may come within the purposes of the improvements or the scope of the following claims.

What is claimed is:

1. An exposure apparatus, comprising:

an optical element; and a gas supplying unit for supplying a predetermined gas to a space around said optical element, said gas supplying unit including (i) electrical discharging means for causing electrical discharging in a gas to be supplied to the space through said gas supplying unit thereby to cause decomposition of an organic compound by the electrical discharging, and (ii) a filter for removing at least one of moisture and carbon dioxide in the gas flowing from said electrical discharging means, wherein the gas passed through said filter is supplied to the space.

2. An apparatus according to claim 1, wherein said electrical discharging means serves to decompose an organic compound on the basis of ionized atoms produced by one of plasma discharging and coronal discharging.

3. An apparatus according to claim 1, wherein said gas supplying unit includes a flow gauge for measuring a flow rate of the gas.

4. An apparatus according to claim 3, wherein said gas supplying unit operates to decompose organic matter on the basis of the measurement by said flow gauge.

5. An apparatus according to claim 1, wherein said gas supplying unit includes a catalyst for decomposing ozone in the gas from said electrical discharging means.

6. An apparatus according to claim 1, wherein said filter serves to remove carbon dioxide.

7. An apparatus according to claim 1, wherein said filter serves to remove moisture.

8. An apparatus according to claim 1, further comprising a densitometer for measuring ozone density in the gas from said electrical discharging means, wherein an electrical discharging voltage of said electrical discharging means is adjusted on the basis of the measurement by said densitometer.

9. A device manufacturing method, comprising the steps of:

providing an exposure apparatus as recited in claim 1; and performing an exposure process by use of the exposure apparatus, while decomposing an organic compound.

10. An exposure apparatus, comprising:

an optical element; and an organic compound decomposing mechanism for decomposing an organic compound contained in a gas within a space around said optical element, said decomposing mechanism including (i) taking means for taking a gas from the space, (ii) electrical discharging means for causing electrical discharging in the gas from said taking means to cause decomposition of an organic compound, and (iii) a filter for performing at least one of (a) removing at least one of moisture and carbon dioxide and (b) decomposing ozone in the gas from said electrical discharging means, wherein the gas passed through said filter is supplied into the space.

11. An apparatus according to claim 10, wherein said electrical discharging means serves to decompose an organic compound on the basis of ionized atoms produced by plasma discharging or coronal discharging.

12. An apparatus according to claim 10, wherein said decomposing mechanism includes a flow gauge for measuring a flow rate of the gas.

13. An apparatus according to claim 12, wherein said decomposing mechanism operates to decompose organic matter on the basis of the measurement by said flow gauge.

14. An apparatus according to claim 10, wherein said decomposing mechanism includes a catalyst for decomposing ozone in the gas from said electrical discharging means.

15. An apparatus according to claim 10, wherein said filter serves to remove carbon dioxide.

16. An apparatus according to claim 10, wherein said filter serves to remove moisture.

17. An apparatus according to claim 10, further comprising a densitometer for measuring ozone density in the gas from said electrical discharging means, wherein an electrical discharging voltage of said electrical discharging means is adjusted on the basis of the measurement by said densitometer.

18. A device manufacturing method, comprising the steps of:

providing an exposure apparatus as recited in claim 10; and performing an exposure process by use of the exposure apparatus, while decomposing an organic compound.

19. An organic substance removing apparatus which is used in an exposure apparatus having a gas supplying unit for supplying a gas into a predetermined space, said organic substance removing apparatus comprising:

a decomposing system for decomposing an organic substance contained in the gas; and a filter for removing at least one of moisture and carbon dioxide in the gas flowing from said decomposing system, wherein the gas passed through the filter is supplied into the predetermined space.

20. An apparatus according to claim 19, wherein said gas supplying unit further includes a flow gauge for measuring a flow rate of the gas.

21. An apparatus according to claim 20, wherein said gas supplying unit performs decomposition of an organic substance on the basis of the measurement made by use of the flow gauge.

22. An apparatus according to claim 19, wherein said gas supplying unit further includes a catalyst for decomposing ozone in the gas discharged from said decomposing system.

23. An apparatus according to claim 19, wherein said filter is adapted to remove at least one of moisture and carbon dioxide.

24. An apparatus according to claim 19, further comprising an ozone densitometer for measuring ozone density in the gas form said decomposing system.

25. An exposure apparatus comprising:

an optical element; and an organic substance removing apparatus as recited in claim 19, wherein said optical element is disposed in a predetermined space as recited in claim 19, and the gas is one of clean dry air, nitrogen and helium.

26. A device manufacturing method, comprising the steps of:

providing an exposure apparatus as recited in claim 25; and performing an exposure process by use of the exposure apparatus, while carrying out decomposition of an organic substance.

27. An exposure apparatus comprising:

an optical element; and a gas supplying unit for supplying a gas into a space surrounding said optical element, wherein said gas supplying unit includes (i) a decomposing system for decomposing an organic substance contained in the gas supplied into the surrounding space, and (ii) a filter for performing at least one of (a) removing at least one of moisture and carbon dioxide in the gas discharged from said decomposing system and (b) decomposing ozone in the gas, wherein the gas passed through said filter is supplied into the surrounding space.

28. An apparatus according to claim 27, wherein said gas supplying unit further includes a flow gauge for measuring a flow rate of the gas.

29. An apparatus according to claim 28, wherein said gas supplying unit performs decomposition of an organic substance on the basis of the measurement made by use of said flow gauge.

30. An apparatus according to claim 27, wherein said gas supplying unit further includes a catalyst for decomposing ozone in the gas discharged from said decomposing system.

31. An apparatus according to claim 27, wherein said filter is adapted to remove at least one of moisture and carbon dioxide.

32. An apparatus according to claim 27, wherein said filter is adapted to remove moisture.

33. A device manufacturing method, comprising the steps of:

providing an exposure apparatus as recited in claim 27; and performing an exposure process by use of the exposure apparatus, while carrying out decomposition of an organic substance.

34. An apparatus according to claim 19, wherein said filter decomposes ozone contained in the gas flowing from said decomposing system.

35. An apparatus according to claim 27, wherein said filter decomposes ozone contained in the gas flowing from said decomposing system.

36. An apparatus according to claim 1, wherein said filter decomposes ozone contained in the gas flowing from said electrical discharging means.

* * * * *

UNITED STATES PATENT AND TRADEMARK OFFICE
CERTIFICATE OF CORRECTION

PATENT NO. : 6,819,396 B1
DATED : November 16, 2004
INVENTOR(S) : Masayuki Tanabe et al.

It is certified that error appears in the above-identified patent and that said Letters Patent is hereby corrected as shown below:

Title page,
Item [56], References Cited, FOREIGN PATENT DOCUMENTS, "JP   01265513   10/1989" should read -- JP   1-265513   10/1989 --; "JP   406323571 A *   1/1994" should read -- JP   6-323571 A *   11/1994 --; "JP   10242029   9/1998" should read -- JP   10-242029   9/1998 --; and "JP   11067618 *   3/1999", should read -- JP   11-67618 * 3/1999 --.

Column 10,
Line 42, "form" should read -- from --.
Line 66, "performing at least one of (a)" should be deleted.

Column 11,
Line 1, "system and (b) decomposing ozone" should read -- system, --.
Line 2, "in the gas," should be deleted.

Signed and Sealed this

Nineteenth Day of April, 2005

JON W. DUDAS
*Director of the United States Patent and Trademark Office*